INVENTOR.
JEROME A. ROSENTHAL
BY
Roland A. Anderson
ATTORNEY.

April 18, 1967 J. A. ROSENTHAL 3,315,181

PULSE MODULATOR CIRCUIT

Filed June 9, 1964

2 Sheets-Sheet 2

INVENTOR.
JEROME A. ROSENTHAL
BY
Roland A. Anderson
ATTORNEY.

United States Patent Office 3,315,181

Patented Apr. 18, 1967

3,315,181

PULSE MODULATOR CIRCUIT

Jerome A. Rosenthal, Lafayette, Calif., assignor to the United States of America as represented by the United States Atomic Energy Commission Filed June 9, 1964, Ser. No. 373,893
1 Claim. (Cl. 332—9)

Figure 1:
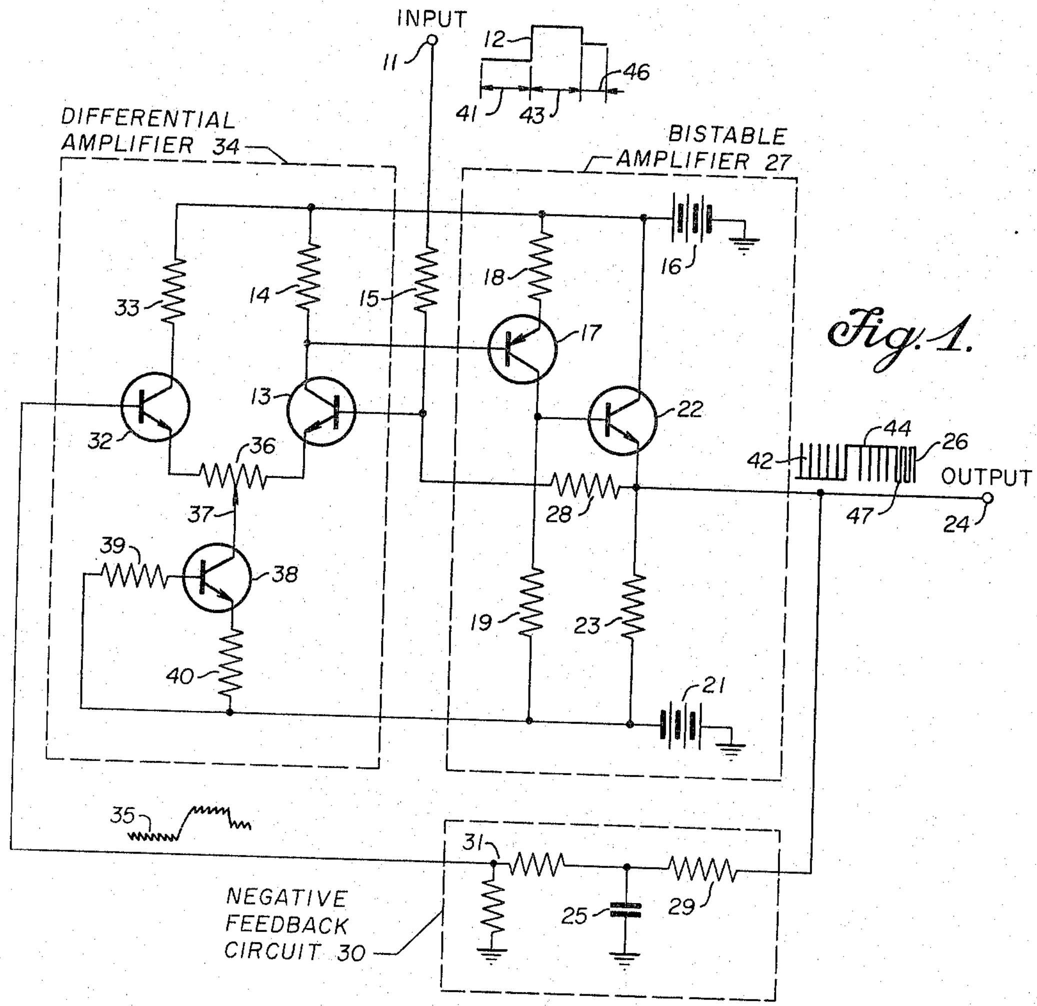

The present invention relates generally to electronic pulse circuitry and more particularly to a pulse modulation circuit for providing a train of high frequency output pulses in which the pulse width and pulse frequency is controlled by a low frequency input signal. The invention described herein was made in the course of or under Contract W–7405–eng–48 with the Atomic Energy Commission.

Pulse modulators are particularly useful when very efficient and low cost amplification with transistors is desired. In a pulse modulator, a steady-state voltage or a variable input signal to be amplified is applied to the modulator. The resultant output signal is typically comprised of a series of pulses of uniform amplitude, but with either variable width, frequency, or both, since different types of modulator produce different types of output signal. Such signals are particularly adapted for use with transistors, which function most advantageously when operated in a switching mode (alternating between a completely cut-off condition and a fully conductive condition) rather than a continuously variable impedance. The switching mode provides a much higher ratio of useful power output to heat dissipation in the transistor than does the conventional variable impedance type of amplification. Thus pulse modulation is very useful in miniaturized portable equipment where low heat dissipation and high efficiency are necessary. Pulse modulation systems are also particularly useful in servo systems where slowly changing voltage or D.C. voltage levels must be efficiently detected, amplified and transmitted.

The present invention is a pulse modulator which provides an output signal similar to that obtained in pulse-ratio modulation wherein the output pulse frequency and pulse width both vary as a function of an input signal. However, unlike previous modulators, the present invention can respond instantly to a change in input signal amplitude. The modulator, in addition to use as an amplifier, can be adapted for use as a multiplier and a divider. As an amplifier, the present circuit has been used, for example, with both servo systems and for amplifying audio voice signals.

In a basic form of the modulator, a direct coupled amplifier provided with positive feedback is utilized, thus the amplifier has only two stable states, either a fully conductive state or a cut-off state. When an input signal crosses a median voltage level the amplifier will shift from one state to the other. In addition to the positive feedback circuit, a negative feedback circuit is provided from the output of the amplifier to the input and includes both an attenuator for reducing the level of the negative feedback signal by a constant ratio and a low frequency pass filter for eliminating high frequency components in the negative feedback signal. The negative feedback signal is then mixed with input modulating signals and applied to the input of the amplifier. There is a hysteresis voltage gap between the "turn-on" input voltage level and the "turn-off" input voltage level for the amplifier. The negative feedback signal causes the amplifier to alternately shift from one state to the other, providing a pulse output signal. A change in the input voltage level modulates both output frequency and output pulse width, that is, altering the time the amplifier remains in one state relative to the time it remains in the other state. If the input voltage suddenly shifts to a new level, a long output pulse having a duration related to the magnitude of input voltage shift is immediately produced, after which the output signal returns to the normal pulse frequency. This type of modulation is similar to pulse-ratio modulation in which both pulse frequency and pulse width are varied as a function of the input signal.

The output signal can be further amplified, if necessary, and used as desired. The output signal is easily demodulated by a low pass filter and the amplifier input signal recovered, since the average D.C. level of the output signal is an amplified representation of the input signal amplitude.

Therefore it is an object of the present invention to provide a faster, more versatile circuit for translating an input signal into a pulse coded output signal.

It is another object of the present invention to provide a pulse coded modulation system having instantaneous response to changes in the input signal level.

It is another object of the present invention to provide a pulse modulator which can be adapted for use either as an amplifier, a multiplier or a divider.

It is another object of the present invention to provide a new pulse modulator having a simplified design and low cost of construction.

It is another object of the present invention to provide a pulse modulator having no output signal when no input signal is applied.

Figure 3:
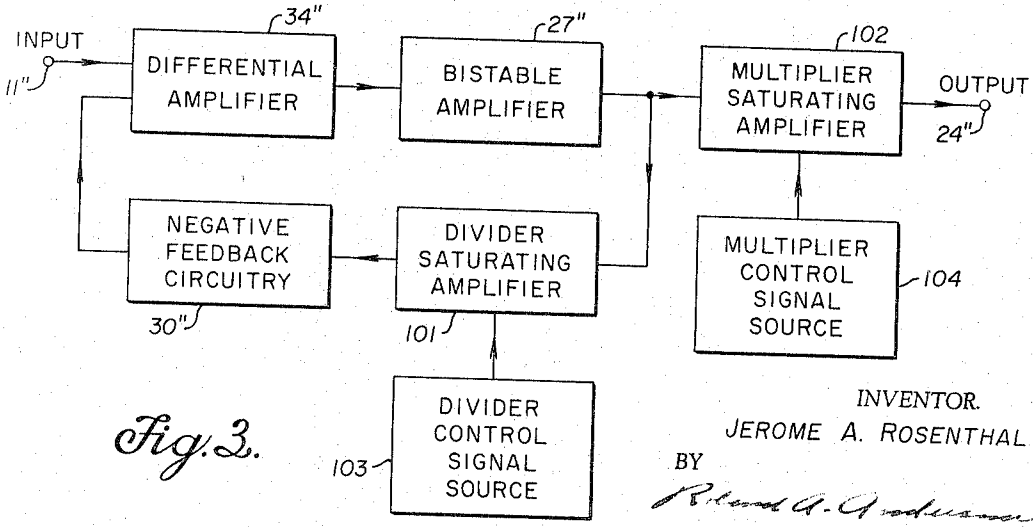
Figure 2:
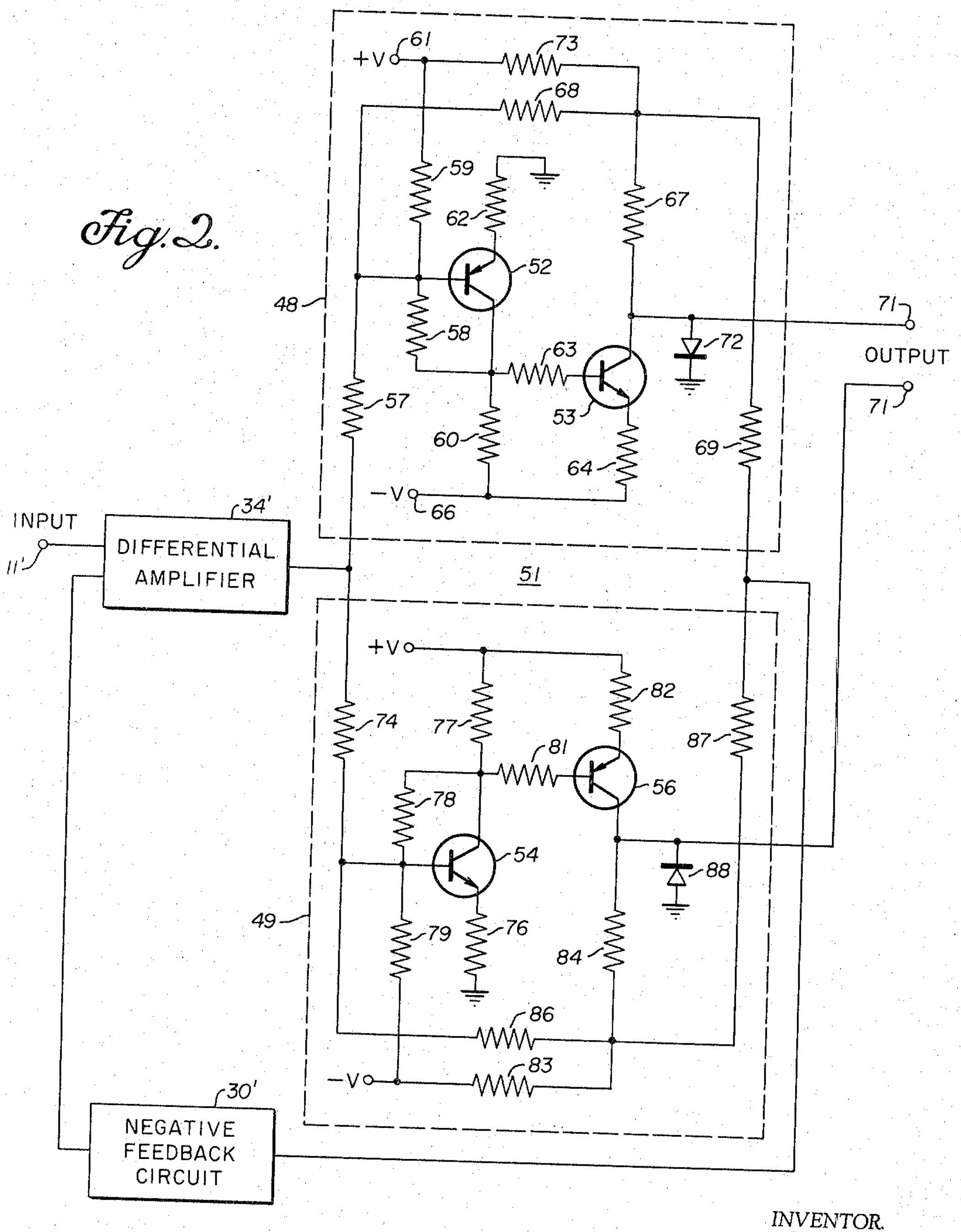

The invention will be best understood by reference to the following specification and the accompanying drawing of which:

FIGURE 1 is a circuit drawing of a two level pulse modulator according to the present invention, FIGURE 2 is a circuit drawing of an alternate type of modulator, providing a tristable mode of operation, and FIGURE 3 is a block circuit drawing of the invention as utilized as a multiplier and a divider.

Referring now to FIGURE 1, there is shown an input terminal 11 to which signals to be pulse code modulated are applied. As an example, an input signal 12 having a rectangular wave shape is assumed to be applied. The input terminal is connected through an input resistor 15 to the base of an NPN input transistor 13. The collector of the input transistor is connected through a load resistor 14 to a positive voltage supply 16. Amplified signals are taken from the collector of the input transistor 13 to the base of a PNP amplifier transistor 17, which has an emitter resistor 18 connected from the emitter to the positive supply 16 and has a collector resistor 19 connected from the collector to a negative voltage supply 21. The base of an NPN emitter follower transistor 22 is connected to the collector of the amplifier transistor 17, the collector of the emitter follower transistor 22 being connected directly to the positive voltage supply 16 while the emitter is connected through an emitter follower resistor 23 to the negative voltage supply 21.

An output terminal 24 is connected to the emitter of the emitter follower transistor 22, and a pulse output signal 26 obtained in response to the input signal 12. The amplifier transistor 17, and emitter follower transistor 22 and associated circuitry together form a direct coupled amplifier 27. A positive feedback signal is coupled through a positive feedback resistor 28 from the output terminal 24 to the base of the input transistor 13. Therefore the emitter transistor 22, and thus the amplifier 27, can only be in one of two states, either fully on or fully cut-off, as in a regenerative switch. There is a median input potential range at which switching between the two states occurs with hysteresis across such range between a turn-on voltage level and a cut-off voltage level.

A negative feedback circuit 30 is coupled from the output terminal 24 through a low frequency pass filter resistor 29 connected in series with a signal level attenuator 31 to the base of a differential transistor 32. A filter capacitor 25 for removing high frequencies is connected from the juncture of the filter resistor 29 and attenuator 31 to a source of steady-state potential, such as circuit ground. A negative feedback signal waveform 35 as produced at the output of the attenuator 31 is indicated and will be discussed hereinafter. The collector of the transistor 32 is coupled through a collector resistor 33 to the positive voltage supply 16. A variable potentiometer 36 is connected between the emitters of the differential transistor 32 and the input transistor 13. The adjustable slider 37 of the potentiometer 36 is connected to the collector of a load transistor 38 which functions as an emitter load for the differential amplifier 34. The base and emitter of the load transistor 38 are both connected through bias resistors 39 and 40 to the negative bus 21.

The differential amplifier 34 thus receives both a negative feedback signal 35 applied through the negative feedback circuit 30 to the differential transistor 32 and a composite of the input signal 12 and the positive feedback signal through the feedback resistor 28 applied to the input transistor 13. The differential amplifier 34 provides an output signal to the amplifier transistor 17, which is the difference between the input signals applied to the bases of the input transistor 13 and differential transistor 32. In the present circuit, the input transistor 13 is a portion of the differential amplifier 34, but is included in the positive feedback loop for the D.C. amplifier 27. Such a circuit configuration is used to obtain proper phasing of the positive feedback signal. In other embodiments of the invention, the positive feedback will not necessarily pass through any portion of the differential amplifier.

Considering now the operation of the circuit of FIGURE 1, assume that the voltage supplies 16 and 21 are activated and that an input signal 12 is applied to the input 11. A first portion 41 of the input signal 21 is relatively negative and therefore the input transistor 13 tends to cut-off. The positive feedback from the output terminal 24 clamps the input transistor 13 in a cut-off condition. The emitter follower transistor 22 is also cut-off and thus the output waveform 26 is at a level equal to that of the negative supply 16. However, the filter capacitor 25 will charge negatively toward the level of output signal 26 until the current through the differential transistor 32 is reduced sufficiently by such negative going feedback signal 35 to cause the input transistor 13 to conduct. When sufficient conduction occurs in input transistor 13, the amplifier 27, owing to the positive feedback, is suddenly caused to become fully conductive and raise the output signal 26 to full voltage, as indicated by positive pulse 42. The negative feedback signal 35 rapidly goes in a positive direction since the full voltage of the pulse 42 is applied to the filter capacitor 25. Thus the magnitude of the current in input transistor 13 is quickly caused to decrease and the amplifier 27 is again cut-off. The voltage at the output terminal returns to the cut-off value. Thus during the first portion 41 of the input signal 12, the output signal 26 consists of a series of short positive pulses with the average voltage level staying near the cut-off value.

Following the first portion 41 of input signal 12, there is a positive portion 43 which forces the amplifier 27 into a fully conductive condition, producing a long positive output pulse 44 until the potential applied to the differential transistor 32 is sufficient to overcome the high input voltage portion 43 and cause the emitter follower transistor 22 to cut-off. However, the input transistor remains cut-off for only a very short time owing to the negative feedback which functions in the same manner, except with opposite polarity, as with the first portion of the input signal 12. Thus the average level of the output signal 26 is near the fully conductive level.

A last portion 46 of the input signal 12 has a voltage level intermediate between the previous portions 41 and 43. After a negative output pulse 47 during which the voltage level of the negative feedback signal 35 shifts, the output signal 26 is equally divided between being cut-off and being fully conductive and the average output signal level is midway between the fully conductive and cut-off levels.

The output signal 26 can be amplified further, transmitted to a distant point, or otherwise utilized. Recovery of the original input signal 12 is easily accomplished by passing the output signal through a low pass filter. In fact, the low pass filter 25, 29 in the negative feedback circuit functions as a demodulator. In audio work, for instance, the pulse output circuit may be applied directly to a loudspeaker, which will function as a low pass filter.

A variation in the operation of the circuit is provided in situations such as with servo systems where it is desirable to have zero output signal when the input signal is zero, thereby improving efficiency by eliminating power dissipation in the load when the input signal is zero. Such a pulse modulator is shown in FIGURE 2 and is referred to as a tristable circuit, since the output signal is either alternating between a fully positive and a fully negative value, or is zero. The overall circuit configuration is in general identical to that described with regard to FIGURE 1. However, the internal configuration of the bi-stable amplifier 27 has been considerably altered to provide the tristable mode of operation. Thus, in the circuit of FIGURE 2 the differential amplifier 34′ and the negative feedback circuit 30′ are shown in block form since such circuits have been previously indicated in FIGURE 1. In the circuit of FIGURE 2, in differential amplifier 34′ the positive feedback connection to the base of input transistor 13 is not used. The output of the differential amplifier 34′ is applied to the input of a tristable amplifier 51. Tristable amplifier 51 is composed of two separate parallel amplifiers 48 and 49 in which first and second transistors 52 and 53 are major components in a bistable amplifier 48 which will only accept negative input signals. Transistors 54 and 56 are major components in second amplifier 49 that amplified only positive input signals. Both of the amplifiers 48 and 49 receive signals from a common source and have combined negative feedback outputs, however neither amplifier responds when the input signal is zero or nearly zero and therefore no pulse modulation is provided at the output.

In the operation of the first amplifier 48, input signals are coupled through a resistor 57 to the base of the first PNP transistor 52 which is biased to exclude all input signals of zero and above. The biasing is provided by bias resistor 58 coupled from the collector to the base of the transistor 52, bias resistor 59 connected from the base to a positive voltage terminal 61, and bias resistor 60 connected from the collector to a negative voltage terminal 66. The emitter of transistor 52 is connected to ground through resistor 62. Signals at the collector of transistor 52 are coupled through resistor 63 to the base of a second NPN transistor 53 which has an emitter coupled through a resistor 64 to a minus voltage terminal 66. Positive feedback signals for producing bistable operation are coupled from the collector of transistor 53 through a resistor 67 to a positive feedback resistor 68 which couples signals back to the base of the first transistor 52. Operating power is provided to the transistor 53 through a resistor 73 connected from the juncture of resistors 67, 68 to positive voltage terminal 61. A negative feedback resistor 69 is also connected from the juncture of resistors 67 and 68 to the negative feedback circuit 30′. A diode 72 is connected from the collector of a second transistor 53 to provide further filtering of any positive potentials which may be present in the output of transistor 53.

For the second amplifier 49, which is quite similar to the first amplifier 48, positive input signals are coupled through an input resistor 74 to the base of the NPN third transistor 54. Operating and biasing potentials are provided to the transistor 54 through emitter resistor 76, collector resistor 77 and base biasing resistors 78 and 79. A coupling resistor 81 is connected from the collector of the transistor 54 to the base of fourth PNP transistor 56. Operating potentials are provided to transistor 56 through emitter resistor 82 and collector resistor 83. Feedback signals are provided through collector resistor 84 in series with resistor 83, with positive feedback signals being applied from resistor 84 to the base of transistor 54 through a positive feedback resistor 86. Negative feedback signals are coupled through resistor 87 to resistor 69 and mixed with the negative feedback signals from the first amplifier 48, the combined negative feedback signals being applied to the negative feedback circuit 30′ as described with regard to the circuit of FIGURE 1. A diode 88 is connected from the collector of the transistor 56 to ground, providing further filtering and stability in the circuit. Output signals are available at a pair of output terminals 71, one terminal being connected to the collector of transistor 53 and the other terminal being connected to the collector of transistor 56.

As previously described, the tri-stable amplifier 51 does not provide a pulse output for a zero potential input, thus in many instances a saving in power is realized. For instance, if the output terminals 71 are coupled through other amplifiers to a servo motor, output pulses are produced only when there is an input signal, and dissipation in the output circuit can be limited to such times. It will be realized, of course, that the tri-stable amplifier may be less suitable than the circuit of FIGURE 1 for linear applications such as for powering a loud speaker system for audio uses and the like.

The circuitry utilized in the bi-stable amplifier of FIGURE 1 can be readily converted into a multiplier or a divider by adding a pair of saturating amplifiers as shown in block form in FIGURE 3. A divider saturating amplifier 101 is connected in series with the negative feedback circuitry 30″ while a multiplier saturating amplifier 102 is connected in series between the bi-stable amplifier 27″ and the output terminal 24″. Both of the saturating amplifiers 101 and 102 are very similar to the bi-stable amplifier 27″, however each of the saturating amplifiers include an electronic level control which varies the amplifier output signal level according to the amplitude of a divider and a multiplier signal from a divider signal source 103 and a multiplier signal source 104. That is, in the saturated amplifiers the output signal can have only two voltage levels, as in the bi-stable amplifier 27″, but in the saturated amplifier the differential between the two voltage levels is directly controllable by a divider or a multiplier signal.

Therefore, by altering the output level of the divider saturating amplifier 101, the amount of negative feec back signal is varied. For instance, if the output leve of the divider amplifier 101 is increased, the ratio c the input signal to the negative feedback signal applie to the bi-stable amplifier 27″ is correspondingly de creased, and thus the amplification of the input signa is inversely proportional to the output signal level o the divider amplifier. The level controlling signal ap plied to the divider amplifier 101 therefore functions a a divisor for an input signal.

The multiplier saturating amplifier 102 multiplies th output of the bi-stable amplifier 27′ by the magnitude o the level control, the multiplier amplifier 102 thus func tioning by varying the amplitude of the output signal a terminal 24″. Both the multiplier and divisor function can be accomplished simultaneously.

It will be apparent to those skilled in the art that numerous variations and modifications may be made within the spirit and scope of the invention and thus it is not intended to limit the invention except as defined in the following claim.

What is claimed is:

In an electronic circuit for modulating an output train of pulses according to an input modulating signal and having no output pulse signal when zero level input modulating signal is applied, the combination comprising a mixer circuit having a first input terminal receiving said input modulating signal and having a second input terminal and an output terminal, a first and a second direct-coupled bi-stable amplifier each having inputs connected to said output terminal of said mixer circuit, said first bi-stable amplifier being biased to amplify only input potentials exceeding said zero level, said second bi-stable amplifier being biased to amplify only input potentials less than said zero level, the outputs of said first and said second bi-stable amplifiers being combined at a negative feedback output terminal, a low frequency pass filter, and an attenuator connected in series with said filter from said negative feedback terminal of said bi-stable amplifiers to said second input terminal of said mixer.

References Cited by the Examiner

UNITED STATES PATENTS

| | | | |
|---|---|---|---|
| 2,491,969 | 12/1949 | Gloess | 332—9 |
| 3,090,929 | 5/1963 | Thompson | 332—9 |
| 3,221,271 | 11/1965 | DeWaard | 332—19 |
| 3,225,216 | 12/1965 | Grabowski | 330—104 X |

ROY LAKE, *Primary Examiner.*

ALFRED L. BRODY, *Assistant Examiner.*